United States Patent
Musser et al.

(10) Patent No.: US 9,466,190 B2
(45) Date of Patent: Oct. 11, 2016

(54) ENCLOSURE ASSEMBLY FOR SECURING A DOOR

(71) Applicant: Brady Worldwide, Inc., Milwaukee, WI (US)

(72) Inventors: Scott Musser, Lititz, PA (US); Mat Sejas, Strasburg, PA (US); Aaron Henderson, Manheim, PA (US)

(73) Assignee: Brady Worldwide, Inc., Milwaukee, WI (US)

( * ) Notice: Subject to any disclaimer, the term of this patent is extended or adjusted under 35 U.S.C. 154(b) by 191 days.

(21) Appl. No.: 14/109,317

(22) Filed: Dec. 17, 2013

(65) Prior Publication Data

US 2015/0167365 A1 Jun. 18, 2015

(51) Int. Cl.
| | |
|---|---|
| *H02B 1/00* | (2006.01) |
| *H05K 5/00* | (2006.01) |
| *H05K 7/00* | (2006.01) |
| *G08B 23/00* | (2006.01) |
| *G08B 13/06* | (2006.01) |
| *F16M 13/02* | (2006.01) |
| *E05B 45/06* | (2006.01) |
| *E05B 47/06* | (2006.01) |
| *E05B 63/04* | (2006.01) |
| *E05B 9/08* | (2006.01) |
| *E05B 13/10* | (2006.01) |
| *H05K 5/02* | (2006.01) |

(Continued)

(52) U.S. Cl.
CPC .................. *G08B 13/06* (2013.01); *E05B 9/08* (2013.01); *E05B 13/10* (2013.01); *E05B 45/06* (2013.01); *E05B 47/0657* (2013.01); *E05B 63/04* (2013.01); *F16M 13/02* (2013.01); *H05K 5/0208* (2013.01); *E05B 63/0069* (2013.01); *E05B 2045/069* (2013.01); *E05B 2045/0635* (2013.01); *E05B 2047/0067* (2013.01); *E05B 2047/0068* (2013.01); *E05B 2047/0069* (2013.01); *E05B 2047/0073* (2013.01); *E05B 2047/0084* (2013.01); *E05B 2047/0094* (2013.01); *Y10T 292/62* (2015.04)

(58) Field of Classification Search
CPC G08B 13/08; G08B 13/126; G07C 9/00944; G07C 9/00912
USPC .......... 361/600, 679.01, 724, 616; 340/693.5
See application file for complete search history.

(56) References Cited

U.S. PATENT DOCUMENTS

| | | | |
|---|---|---|---|
| 4,802,353 A * | 2/1989 | Corder | ................ E05B 47/0661 70/277 |
| 5,245,329 A | 9/1993 | Gokcebay | |
| 5,280,518 A | 1/1994 | Danler et al. | |

(Continued)

FOREIGN PATENT DOCUMENTS

| | | |
|---|---|---|
| DE | 4405693 A1 | 8/1995 |
| DE | 19738938 A1 | 7/1999 |

(Continued)

OTHER PUBLICATIONS

PCT International Search Report and Written Opinion, PCT/US2014/066391, Jul. 22, 2015.

*Primary Examiner* — Emily C Terrell
(74) *Attorney, Agent, or Firm* — Quarles & Brady LLP

(57) ABSTRACT

Disclosed are systems and methods for an enclosure assembly for securely mounting an electronic component to an exterior surface of a door via attachment of a latching mechanism to the door.

16 Claims, 7 Drawing Sheets

(51) Int. Cl.
 *E05B 63/00* (2006.01)
 *E05B 47/00* (2006.01)

(56) References Cited

U.S. PATENT DOCUMENTS

| | | | |
|---|---|---|---|
| 5,771,722 A | 6/1998 | DiVito et al. | |
| 5,923,264 A * | 7/1999 | Lavelle et al. | 340/5.64 |
| 6,008,726 A | 12/1999 | Hagen | |
| 7,681,424 B2 * | 3/2010 | Antonucci | E05B 1/0092 292/207 |
| 7,818,984 B2 * | 10/2010 | Hwang | 70/107 |
| 8,143,519 B2 * | 3/2012 | Puccini | H02B 1/32 174/50 |
| 2008/0258911 A1 * | 10/2008 | Gray | G08B 7/062 340/540 |
| 2009/0027194 A1 * | 1/2009 | McGrath | 340/540 |
| 2011/0254658 A1 * | 10/2011 | Hui | E05B 7/00 340/5.2 |
| 2013/0285393 A1 * | 10/2013 | Roatis | E05B 47/0012 292/336.3 |
| 2013/0327142 A1 * | 12/2013 | Hogan et al. | 73/493 |
| 2014/0300117 A1 * | 10/2014 | Scheffler | E05B 47/0012 292/336.3 |

FOREIGN PATENT DOCUMENTS

| | | |
|---|---|---|
| DE | 20005083 U1 | 6/2000 |
| DE | 10049085 A1 | 4/2002 |
| DE | 102004013369 A1 | 10/2005 |
| EP | 0334396 A2 | 9/1989 |
| EP | 1405969 A1 | 4/2004 |
| GB | 2425327 A | 10/2006 |
| JP | 2002155644 A | 5/2002 |
| WO | 9709501 A1 | 3/1997 |
| WO | 2009109972 A1 | 9/2009 |
| WO | WO 2012096647 A1 * | 7/2012 |

* cited by examiner

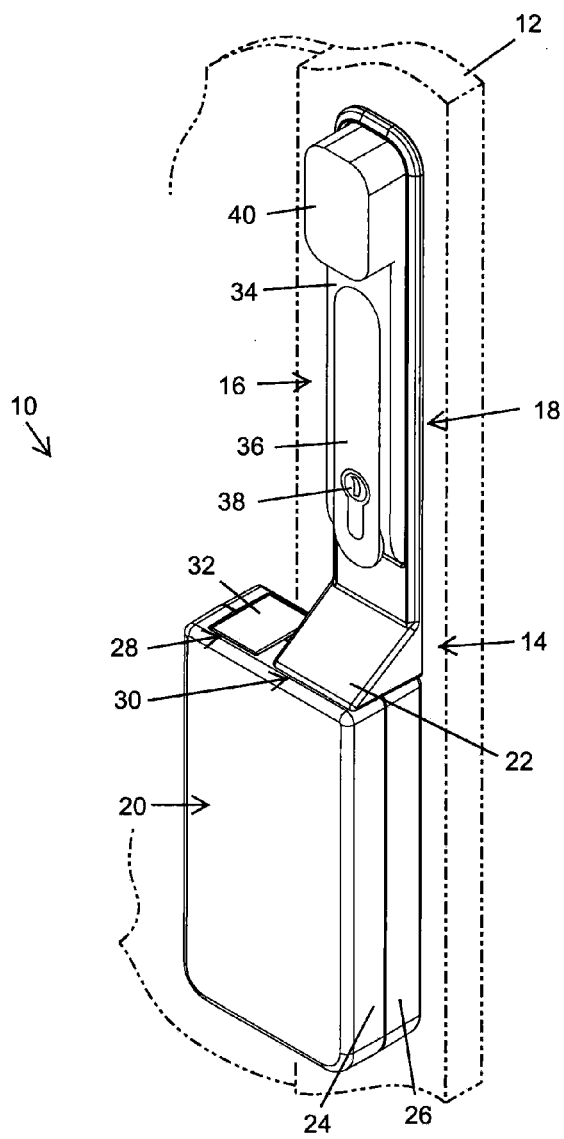
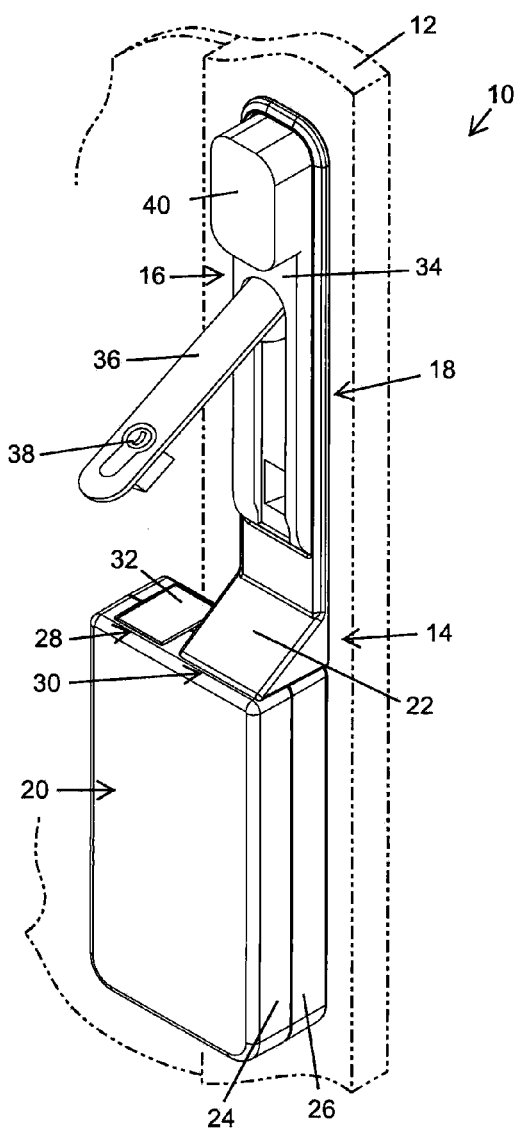

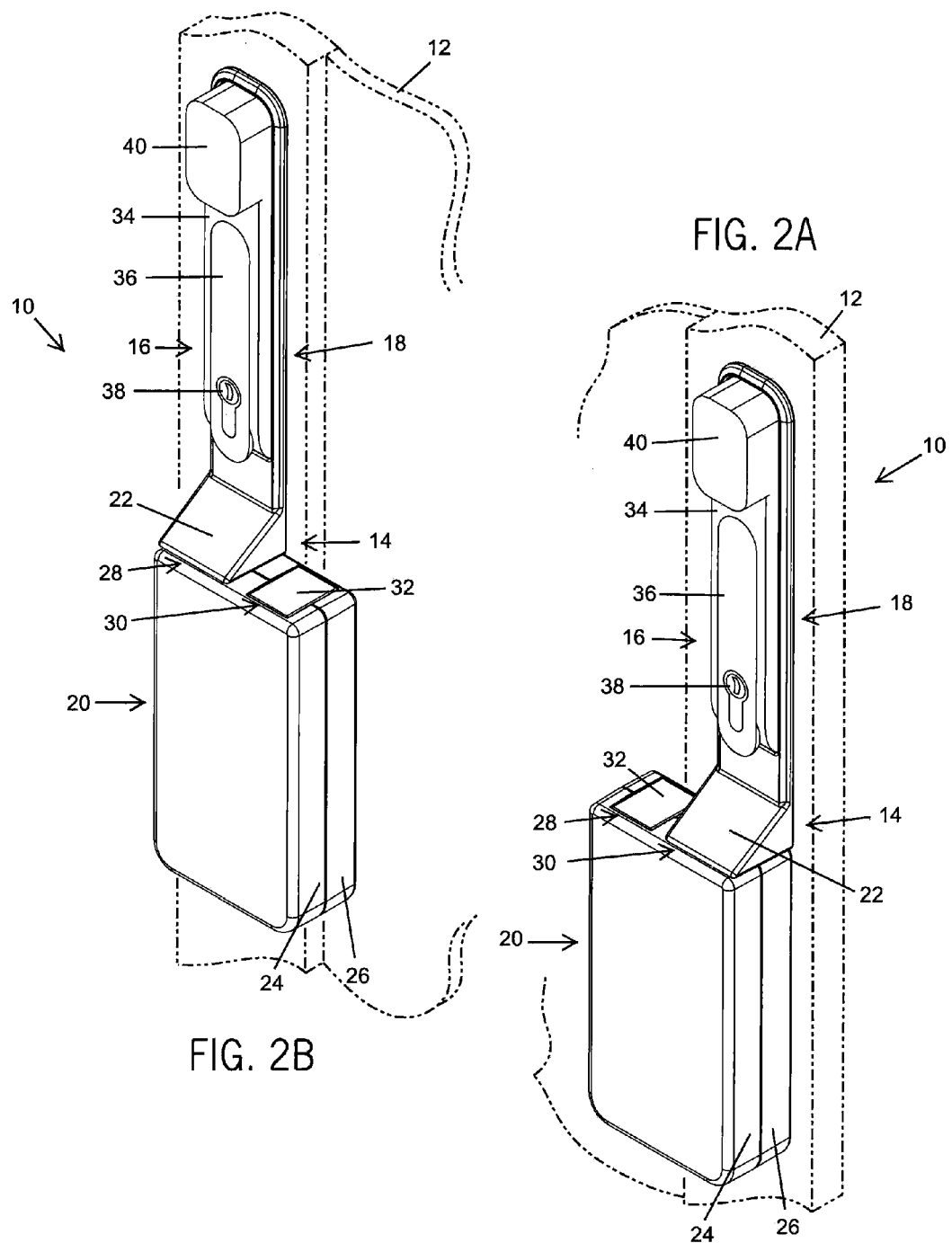

1

ENCLOSURE ASSEMBLY FOR SECURING A DOOR

CROSS-REFERENCE TO RELATED APPLICATION

Not applicable.

STATEMENT OF FEDERALLY SPONSORED RESEARCH OR DEVELOPMENT

Not applicable.

BACKGROUND

This invention relates to securing a door. More particularly, this invention relates to a secure enclosure assembly to be mounted on the outside of the door.

Many doors, such as doors for a cabinet containing a server rack in a data center, have security features associated with them. These security features can range from a locking mechanism on the door latching mechanism (for example, a doorknob, a door handle, or so forth) to a deadbolt with a chain extending from the wall to the door to prevent the door from opening all the way. In some environments, extra security protocols may be required to monitor the status of a door as well as the activity of the door.

Assembly of the components for door security systems can be onerous and complex. Conventionally, the components of the security system are mounted inside the door and, therefore, occupy some volume within the cabinet. Further, when electrical components are involved, if these electrical components are not mounted inside the door, these electrical components are often installed at a remote location from the door latch, which can require a more vigorous installation and much wiring.

Further, specific components are often required for assembly of the security system based on the particular direction of door swing. For example, a particular component such as a locking mechanism may only be designed to be mounted on doors opening in a certain direction of swing (for example, doors opening from the right that are hinged on the left side versus doors opening from the left that are hinged on the right side).

Hence, a need exists for improved security systems for doors that are easily installed in a variety of configurations.

SUMMARY OF THE INVENTION

A secure enclosure assembly is disclosed that is mountable to a door using the other hardware attached to the door such as a latching or locking mechanism. For example, this secure enclosure assembly may be mounted to the outside of the door via a mechanical attachment of a latching mechanism to the door. The secure enclosure assembly can securely contain electrical and/or mechanical components relating to the operation of or the monitoring of one or both of the latching mechanism and a locking mechanism of the door. Advantageously, the secure enclosure assembly may be configured to be universally mountable on the door to accommodate for different directions of door swing. Accordingly, separate parts and inventory for different configurations of door swing can be avoided.

According to one aspect of the invention, an enclosure assembly for securely mounting an electronic component or other element to an exterior surface of a door via the attachment of a latching mechanism to the door is provided.

2

The enclosure assembly includes a mounting frame and an attached housing. The mounting frame includes a mounting opening formed therein through which the latching mechanism is attachable to the door for securely mounting the mounting frame of the enclosure assembly to the door. The housing is attached to the mounting frame at a base end of the mounting frame and this housing includes an interior volume into which the electronic component or other element is receivable. The housing includes sidewalls that, at least in part, define the interior volume and that include at least one connection opening formed therein for reception of the base end of the mounting frame. The base end of the mounting frame is received in the connection opening or one of the connection openings to securely connect the mounting frame to the housing.

In one form, there may be two or more connection openings and each of the connection openings may be configured to receive the base end of the mounting frame. A filler plate may be received into each of the connection openings in which the base end of the mounting frame is not received. Although this filler plate may be somewhat aesthetic in quality, it may also help to ensure the interior volume of the housing is inaccessible when the enclosure assembly is mounted to the door.

In another form, the housing may include a cable opening configured to receive one or more cable such as data cables although. It is contemplated that the cable could be a multi-conductor including various wires for different functions (for example, one or more data or power wires). This cable opening may be formed on a back side wall of the housing and may align with an opening in the door in order to permit one or more cables to pass from the interior volume of the housing directly into the cabinet through the door without exposing the cable in order to avoid tampering with the cables when the door is closed.

In yet another form, the base end of the mounting frame may have a channel formed therein. By this channel, the base end of the mounting frame may be placed in communication with the interior volume of the housing through the connection opening and the channel.

The housing may include a front half and a rear half that are connected together. The connection of the front half to the rear half may secure the base end of the mounting frame in the connection opening or, where there are multiple connection openings, one of the openings. For example, the base end of the mounting frame may be in slotted engagement with one or both of the front half and the rear half and, by connecting the front and rear halves together, the base end may be captured or locked between the two halves. One or more fasteners may be used to connect the front half of the housing to the rear half of the housing although other forms of connection (for example, one-way snapped connection of the halves with deformable prongs with teeth fitting into grooves) may also be used. A mounting plane on a back side of the housing for contacting the exterior side of the door may include portions of both the mounting frame and the rear half of the housing so that the fastener or fasteners are only accessible from the rear half of the housing through the mounting plane. This means that the fastener or fasteners may be accessible when the enclosure assembly is initially constructed, but not accessible when the enclosure assembly is mounted to the door as the openings to access the fastener or fasteners are located on the back side that abuts the door.

According to another aspect of the invention, a secure cabinet assembly is disclosed that includes a cabinet having a door that provides selective access to an interior of the cabinet. The secure cabinet assembly includes a latching mechanism mounted to the door. The latching mechanism is adapted to selectively lock the door and provide access to the interior of the cabinet via the door. In addition, the secure cabinet assembly includes an enclosure assembly securely mounted to an exterior surface of the door (that is, not on the inside surface of the door for the cabinet) via connection of the latching mechanism to an exterior surface of the door. As described above, the enclosure assembly includes a mounting frame and a housing. The mounting frame includes a mounting opening formed therein through which the latching mechanism is attached to the door, thereby securely mounting the mounting frame of the enclosure assembly to the door. The housing has an interior volume in which an electronic component is received. The housing has sidewalls that, at least in part, define this interior volume. One or more connection openings are formed in the sidewalls for reception of the base end of the mounting frame. The base end of the mounting frame is received in the connection opening (or one of the connection openings) to securely connect the mounting frame to the housing.

The enclosure assembly that is a part of this secure cabinet assembly may incorporate any of the features, aspects, or forms described above with respect to the enclosure assembly.

In one form of the secure cabinet assembly, the latching mechanism may further include a first cable, wherein the electronic component is configured to receive the first cable through a passageway or channel in the base end of the mounting frame. In addition to the cable received through the base end of the mounting frame, the circuit board may receive a second cable through a cable opening in the back side wall of the housing (as described above) in which the second cable extends from an inside of the cabinet volume through an opening in the door and the housing.

According to yet another aspect of the invention, a method is disclosed of monitoring a door for a secure cabinet in which a latching mechanism, which is lockable, is actuatable to enable the door to be open. The method includes monitoring whether the door is in an open state or closed state, whether a latching mechanism is in an open state or closed state, and whether an override key has been used to unlock the latching mechanism. The method also includes transmitting an alarm signal if the override key is used to unlock the latching mechanism.

In one form, a latch of the latching mechanism may be alternatively unlockable for actuation (a) using the override key and (b) by actuation of a lock for the latch electronically using at least one of a key card and an electronic command sent by software.

In some forms, the method may further include receiving a request to unlock the latching mechanism and unlocking the latching mechanism remotely based on this request.

In some forms, the method may include, if a key card is being used to unlock the latching mechanism, identifying the specific key card that is being used to open the door.

In another form, the method may include transmitting an alarm signal (for example, sounding an alarm) the door is left open for a duration of time exceeding a pre-defined duration of time. Also, the method may include transmitting an alarm signal if the latching mechanism is left open for a duration of time exceeding a pre-defined duration of time. The method may include monitoring for either of these events and be send an alarm signal if either or both of these events occur. In addition, the method may include transmitting an alarm signal if an enclosure assembly mounted with the latching mechanism is damaged.

In some forms of the method, an access report to the secure cabinet may be compiled comprising information relating to the open state or closed state of the door, to the open state or closed state of the latching mechanism, and to the use of an override key to unlock the latching mechanism. In combination, these three items may provide valuable information relating to the access history of the cabinet.

These and still other advantages of the invention will be apparent from the detailed description and drawings. What follows is merely a description of some preferred embodiments of the present invention. To assess the full scope of the invention the claims should be looked to as these preferred embodiments are not intended to be the only embodiments within the scope of the claims.

BRIEF DESCRIPTION OF THE DRAWINGS

FIGS. 1A and 1B are perspective views of an exemplary enclosure assembly mounted to a door with a latching mechanism in which the latching mechanism is closed in FIG. 1A and open in FIG. 1B.

FIGS. 2A and 2B are perspective views of examples of the enclosure assembly mounted on different lateral sides of the door. In FIG. 2A, the enclosure assembly is mounted on the right side of the door, whereas in FIG. 2B, the enclosure assembly is mounted on the left side of the door.

DETAILED DESCRIPTION

Figure 3:
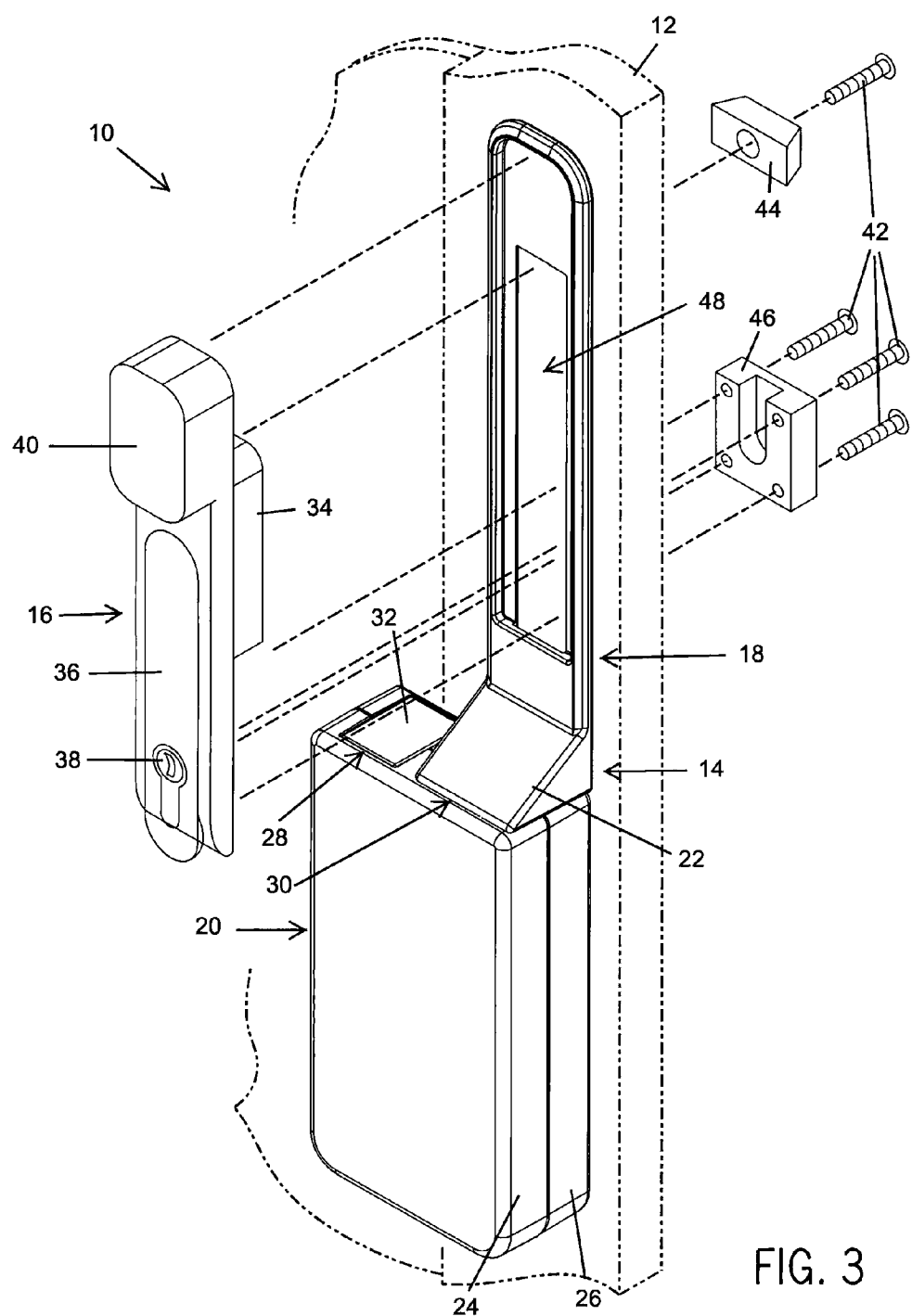
FIG. 3 is an exploded view of the door assembly in which the latching assembly and mounting hardware are exploded away from the enclosure assembly on the door.

Referring first to FIG. 1A, a secure cabinet assembly 10 for securing a door 12 is shown. The secure cabinet assembly 10 includes an enclosure assembly 14 mounted to the exterior side of the door 12 by way of a latching mechanism 16.

The enclosure assembly 14 includes a mounting frame 18 and a housing 20 that is connected to the mounting frame 18 at a base end 22 of the housing 20. In the particular embodiment illustrated, the housing 20 receives a circuit board (which is not shown in FIG. 1A as the circuit board is located in the interior volume of the housing 20); although it is contemplated that other elements, either electrical or mechanical may be received in the housing 20. As one example, it is contemplated that an RFID reader or other near-field communication devices may be securely received in the housing 20.

With forward reference to FIG. 3, the mounting frame 18 includes a centrally-disposed mounting opening 48 (not shown in FIG. 1A because the latching mechanism 16 covers the mounting opening 48). The mounting opening 48 is sized and configured such that, when the latching mechanism 16 is secured to the door 12 through the mounting opening 48, as will be described below, the mounting frame 18 and its attached housing 10 are securely mounted to the door 12 to form the secure cabinet assembly 10.

Figure 4:
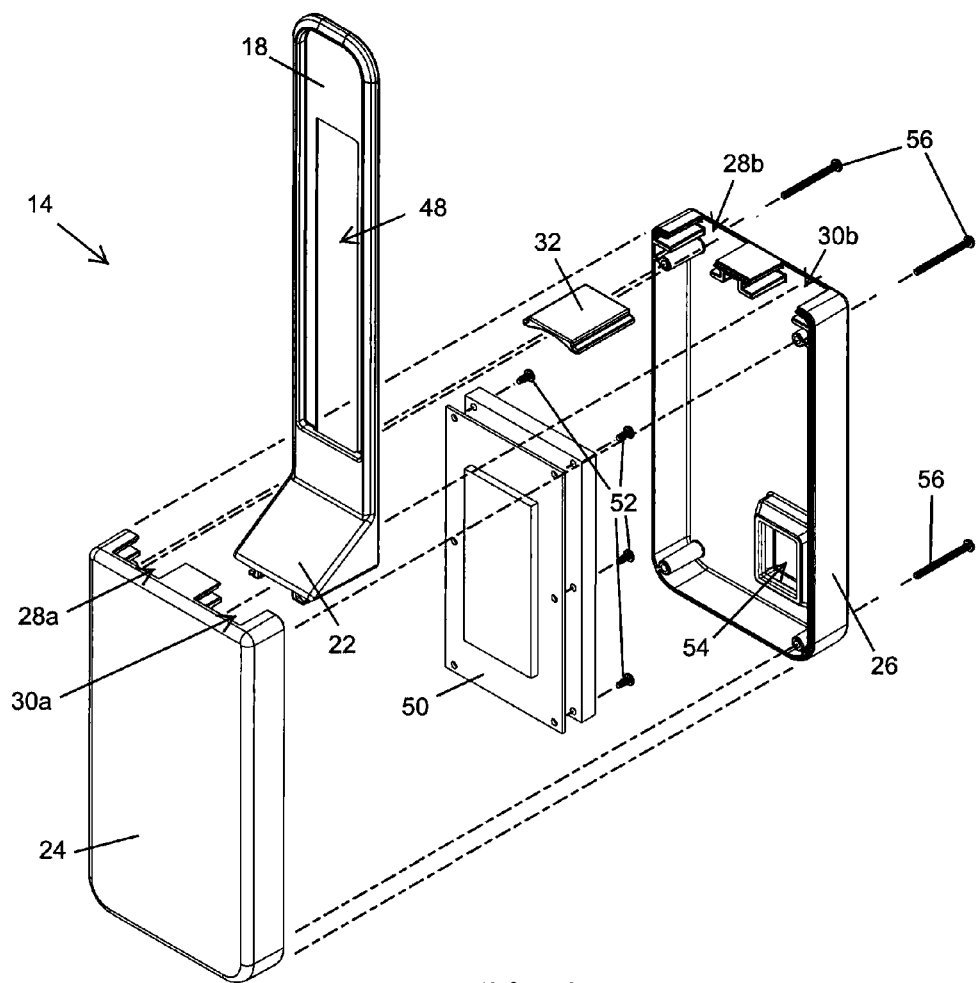
FIG. 4 is an exploded perspective view of the enclosure assembly disassembled into respective components.

With additional forward reference to FIG. 4, in the illustrated embodiment, the housing 20 includes two halves, a front half 24 and a rear half 26, that are joined together in clamshell fashion to form the housing 20. The housing 20 has an interior volume that is generally defined by the front wall and sidewalls of the front half 24 and the back wall and sidewalls of the rear half 26 when the front half 24 and the rear half 26 are joined together.

In the sidewalls of the housing 20, a pair of connection openings 28 and 30 are formed by corresponding facing slots 28*a*, 28*b* and 30*a*, 30*b* in the front half 24 and rear half 26 of the housing 20. In the particular embodiment illustrated, the connection openings 28 and 30 are disposed in the top sidewalls of front half 24 and the rear half 26 of the housing 20.

As illustrated in FIGS. 1A and 1B, one of connection openings 30 receives the base end 22 of the mounting frame 18, while the other of the connection openings 28 is filled with a filler plate 32. As best illustrated in the exploded view of FIG. 4, the connection openings 30 include facing slots into which grooved ends of the base end 22 and the filler plate 32 are received.

Although only two connection openings 28 and 30 are present in the illustrated embodiment and are shown as including edges formed from both halves 24 and 26 of the housing 20, there may be different numbers of housing parts and one or more connection openings. For example, in some embodiments there may be two or more connection openings for selective receipt of the mounting frame 18 and any filler plate or plates. In some embodiments, it is contemplated that only a single connection opening may be formed (and the mounting frame 18 may be formed to be left- or right-sided and received in this single opening to provide for left and right-sided mounting arrangements as will be further described below). In other embodiments, the connection openings may be formed in ways other than by corresponding facing slots in separate housing pieces. For example, slots forming the connection openings might be primarily formed in one half of the housing and another half of the housing may simply form a single edge of the connection opening. Still yet, it is contemplated the housing 20 may be integrally formed as a single piece and that the connection opening or openings may be formed as openings in this single component without any components mating to form the housing. In such an integral housing structure, the base end and filler plate or plates may be elastically deformed and snapped into place within the connection openings.

The latching mechanism 16 includes a separate housing 34 that is mounted to or through the door 12. This latching mechanism 16 includes a swing latch 36 hingedly connected the housing 34 for opening the door 12. In order for the swing latch 36 to be movable (so that the door 12 can be unlocked and opened), the swing latch 16 itself must be first unlocked. This may be done either electronically or electromechanically (for example, by the use of a key card in a key card reader that may be received in the housing 20 or using an electronic locking mechanism 40 that is part of the latching mechanism 16) or purely mechanically by unlocking of a mechanical locking mechanism 38 (such as by the unlocking a keyhole locking mechanism using a mechanical key which may be pre-established as a mechanical override for the lock of the latching mechanism). As will be noted below, there can be ways of determining how the latch 36 was unlocked in order to provide alerts or alarms related to access of the cabinet.

It is noted that the swing latch 36 is shown in the closed position in FIG. 1A and that the swing latch 36 is shown rotated up to the open position in FIG. 1B after the swing latch 36 has been unlocked. Although not illustrated, the movement of the swing latch 36 can actuate a pawl or other extendable member from the door 12 that selectively engages the wall of the cabinet to lock the door or permit the door to be opened. In some embodiments, the electronic locking mechanism 40 of the latching mechanism 16 may normally be in a de-energized state, which keeps the latching mechanism 16 locked (i.e., prevents the swing latch 36 from being rotated to open the latching mechanism 16 and the door 12). When a valid key card is presented at the electric locking mechanism 40, the electronic locking mechanism 40 may be placed in an energized state. When the electric locking mechanism is in an energized state, the latching mechanism 16 can be unlocked such that the swing latch 36 can be swung and the door 12 may be opened using the latch 36.

In some embodiments, the latching mechanism 16 may be considered secure when the electronic locking mechanism 40 is de-energized, the mechanical locking mechanism 38 is closed, and the latch 36 is secure. The latching mechanism 16 may be considered unsecure when the latch 36 is left unsecure (that is, not in the closed position), even if the door 12 is closed and even when the electronic locking mechanism 40 is de-energized and the mechanical locking mechanism 38 are closed or have not been operated.

It is contemplated that the cabinet may not be secure in some situations, even when the latching mechanism 16 appears secure. For example, the latching mechanism 16 may appear secure (swing latch 36 down, electronic locking mechanism 40 de-energized, and mechanical locking mechanism 38 not operated) but the cabinet left unsecure by leaving the door 12 open.

Turning now to FIGS. 2A and 2B, enclosure assembly 14 and latching mechanism 16 for securing the door 12 is illustrated as being mounted on the right and left sides of the door 12, respectively, to accommodate for either right or left door swing. Notably, as the connection openings 28 and 30 in the housing 20 are each configured to receive either the base end 22 of the mounting frame 18 or the filler plate 32, the side of the housing 20 that the mounting frame 18 is received in during assembly of the enclosure assembly 14 can be varied. In other words, the secure enclosure assembly 14 is adaptable for mounting to either side (left or right) of the door 12. This might also be achieved if there is only one connection opening by forming the mounting frame 18 to be left or right-sided (that is, the mounting loop and opening is on one of the sides of the insert that is received in the connection opening).

Accordingly, one advantage of this secure cabinet assembly 10 is that the same enclosure assembly 14 may be mounted to the door 12 by way of the latching mechanism 16 if the door 12 opens from the right or from the left. This means that suppliers of the enclosure assembly 14 do not need to stock separate and different left and right-swing units and that parts described herein can be assembled by the end user or installer to work in either sided configuration.

Referring now to FIG. 3, an exploded view of the secure cabinet assembly 10 is shown in which the latching mechanism 16 is exploded from the door 12. As illustrated in FIG. 3, to attach the enclosure assembly 14 to the door 12, the latching mechanism 16 is mounted to and through the door 12 with several fasteners 42 and mounting blocks 44 and 46 that are secured on the back side of the door 12 (that is, the side of the door 12 that will be in and facing the internal cabinet volume when the door 12 is closed). As illustrated, the latching mechanism 16 is installed through the mounting opening 48 of the mounting frame 18 and a corresponding opening formed in the door 12. By mounting the latching mechanism 16 to and through the door 12 through the mounting opening 48, the enclosure assembly 14 is also mounted to front side or exterior side the door 12 so that the enclosure assembly 14 securely hangs from the latching mechanism 16.

Thus, in the embodiment illustrated, no additional hardware or fasteners are required to mount the enclosure assembly 14 to the door 12 as the mounting of the latching mechanism 16 to the door 12 alone is sufficient to mount the enclosure assembly 14 to the door 12. Of course, there could also be hardware that helps to mount or support the enclosure assembly 14 to the door 12 in addition to mounting of the mounting frame 18 to the door 12 using the latching mechanism 16. Further, as illustrated, no part of the mounting opening 48 is clearly exposed on the exterior side of the door 12, so the as-installed assembly is highly tamper-proof.

Referring now to FIG. 4, an exploded view of the enclosure assembly 14 is shown. A circuit board 50 is housed in the enclosure assembly 14 and this circuit board 50 is configured to be attached to the inside of the front half 24 of the housing 20 with a first set of fasteners 52. In the embodiment illustrated, the rear half 26 of the housing 20 has a cable opening 54 for a cable such as a data cable (not shown in FIG. 4) that can be connected to the circuit board 50 from the interior of the door 12 through a separate opening formed or drilled into the door 12. Although the rear housing 26 includes a cable opening 54, it will be appreciated that such a cable opening 54 is optional. Further, it will be appreciated that the cable could be a multi-conductor including various wires or leads and these wires could potentially perform different functions (for example, serve as power leads or data lines).

To complete the assembly of the housing 20, the front half 24 of the housing 20 and the rear half 26 of the housing 20 are brought together at their sidewalls and connected together with one or more fasteners 56. However, before the front half 24 of the housing 20 and the rear half 26 of the housing 20 are fastened together, the base end 22 of the mounting frame 18 and the filler plate 32 are placed into the connection openings 28a, 28b, 30a, and/or 30b. The base end 22 of the mounting frame 18 and the filler plate 32 are then locked in place or secured in position by the connection of the front half 24 of the housing 20 and the rear half 26 of the housing 20 using the fastener or fasteners 56. Once again, the base end 22 of the mounting frame 18 and the filler plate 32 may be placed in either connection opening 28 or 30 interchangeably to accommodate for different door swings.

While a specific structure for connecting the mounting frame 18 and the filler plate 32 to the housing 20 is described and illustrated, it is contemplated that the housing and specific form of connection between the mounting frame and the housing might be altered. For example, the way in which the various connections are formed may differ based on the manner in which the housing is formed and the number of parts of the housing. For example, instead of sliding engagement in a slot and groove manner between the base end of the mounting frame or the filler plate and each respective connection opening, it is contemplated that the base end of the mounting frame and the filler plate might be adapted to deformably snap one-way into the connection opening or openings formed in the housing.

Figure 5:
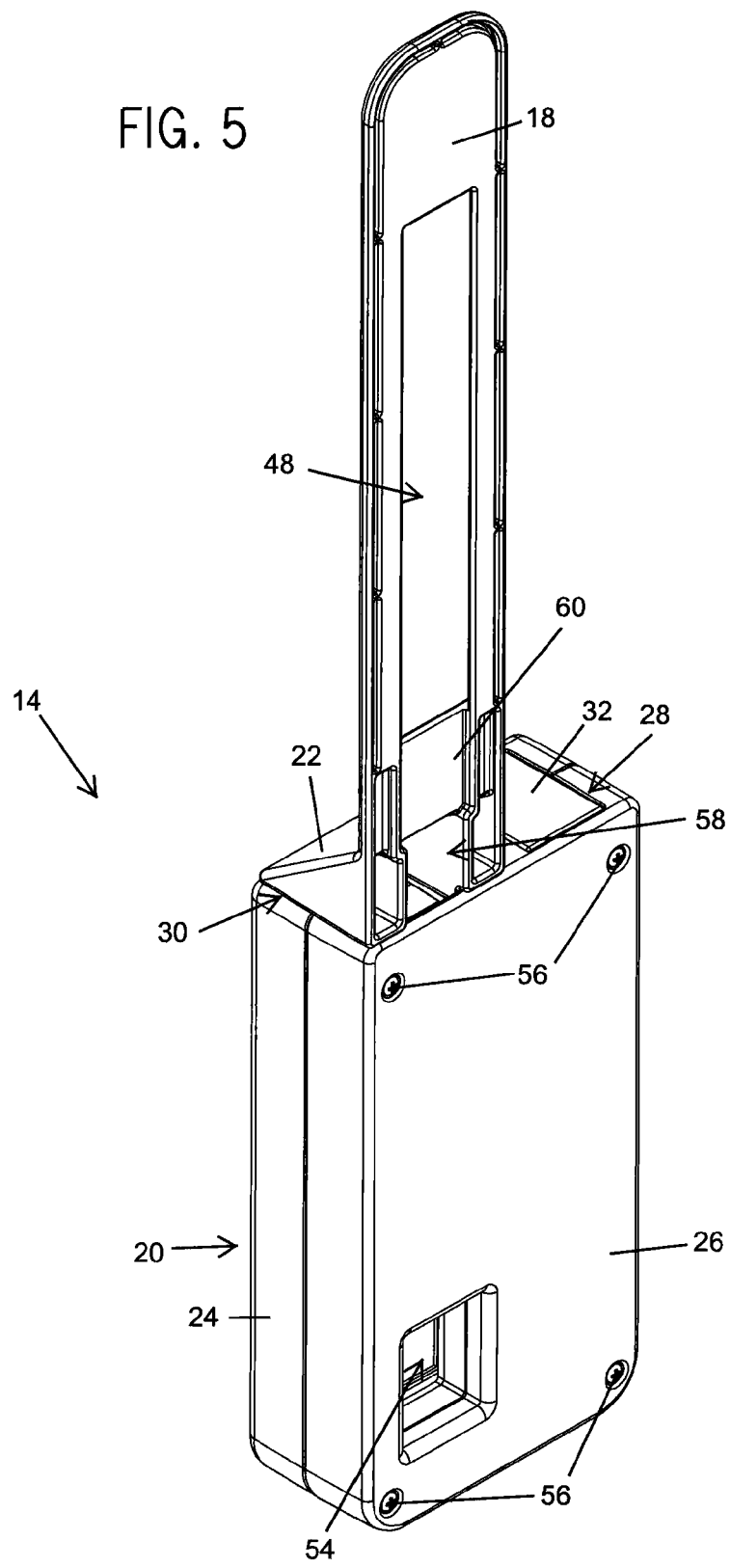
FIG. 5 is a rear side perspective view of the enclosure assembly.

Referring now to FIG. 5, a rear view of the secure enclosure assembly 14 is shown. A mounting plane on the back side of the secure enclosure assembly 14 is illustrated in FIG. 5 that includes the large flat back surface of the rear half 26 of the housing 20 and the back surface of the mounting frame 18. Having a mounting plane can have some significant advantages with respect to security of the enclosure assembly 14. First, as in the embodiment illustrated, the fasteners 56 connecting the front half 24 of the housing 20 to the rear half 26 of the housing 20 extend through openings only accessible on the large flat back surface of the rear half 26 of the housing 20. These openings are not accessible from the exterior of the door 12 because they are pressed against or at least face the exterior surface of the door 12 when the enclosure assembly 14 is mounted to the door 12. As such, when the enclosure assembly 14 is mounted to the door 12, the fasteners 56 cannot be accessed, much less unfastened, by someone on the exterior of the door 12 thereby protecting the internal contents of the enclosure assembly 14 from tampering. Second, the cable opening 54 is also pressed against or faces the exterior surface of the door 12. This allows the installer to drill a hole through the door 12 to get a cable (not shown) from the interior of the door 12 to the circuit board 50 without having any exposed wires or cables when the door 12 is closed. Third, the base end 22 of the mounting frame 18 has channel 58 for the passage of cables or other wiring between the latching mechanism 16 and the interior volume of the housing 20 containing the electronic circuit board 50. There is also be a recess 60 on the back side of the mounting frame 18 (which is offset from the mounting plane of the enclosure assembly 14) that accommodates the passage of such wires between the channel 58 in the base end 22 of the mounting frame 18 and bottom end of the latching mechanism 16.

Figure 6:
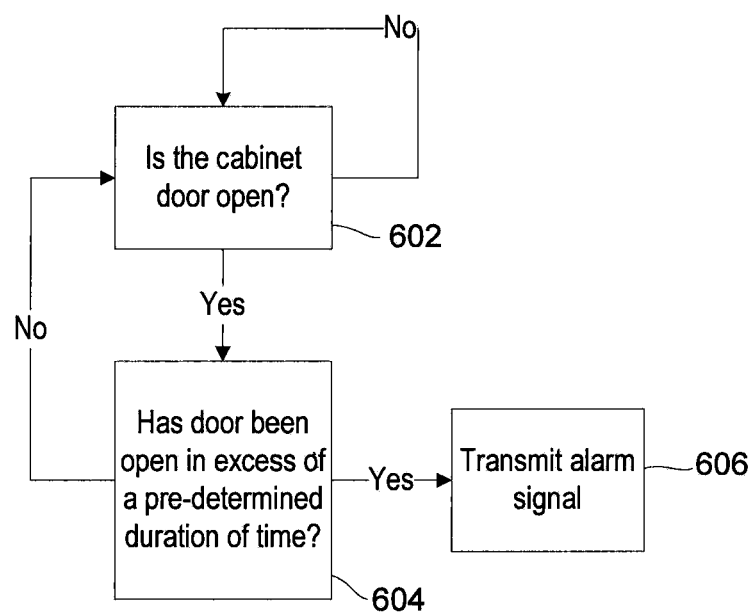
FIG. 6 is a flowchart of an exemplary method for monitoring a door state.

Turning now to FIG. 6, a flowchart setting forth the steps of an exemplary method for monitoring a door state of the previously described secure cabinet assembly 10 is shown. The method begins with monitoring whether the door 12 is open or closed, as indicated in step 602. This can be done using a separate door sensor or switch that established whether the door 12 is in an open or closed position. Such a sensor may be positioned around the hinge area of the door 12 or may be disposed at an edge of the interface between the door 12 and the door frame of the cabinet that the door 12 is received into. If the door 12 is closed, then the door 12 is continually or periodically monitored to check to see if the door has been open, as denoted by the arrows around step 602. Once the door is open as determined by the switch or sensor, it is determined whether the door 12 has been opened for a length of time in excess of a pre-determined or pre-established duration of time according to step 604. If the door 12 has been open for too long, an alarm may be triggered as indicated in step 606, and an alarm signal may be transmitted. If the door 12 has not been open for a sufficient duration of time to trigger an alarm, then the method may restart the cycle and continue to monitor whether the door is open or closed, as indicated in step 602. It is observed that some common reasons the door 12 might be left opened might relate to an operator (who had sufficient privileges to open the door 12) forgetting to close the door 12 or inadvertently not fully closing and securing the door 12. In either situation, an alert that this condition has occurred may be helpful to reestablish the security of the door 12.

As some non-limiting examples, this alarm signal may be audible (such as a persistent beeping), may be visual (such as a LED light), or may be an electronic signal that is passed to software that indicates at computing device or terminal (either locally or remotely disposed) that the door 12 to the secure cabinet assembly 10 has been opened for too long.

Figure 7:
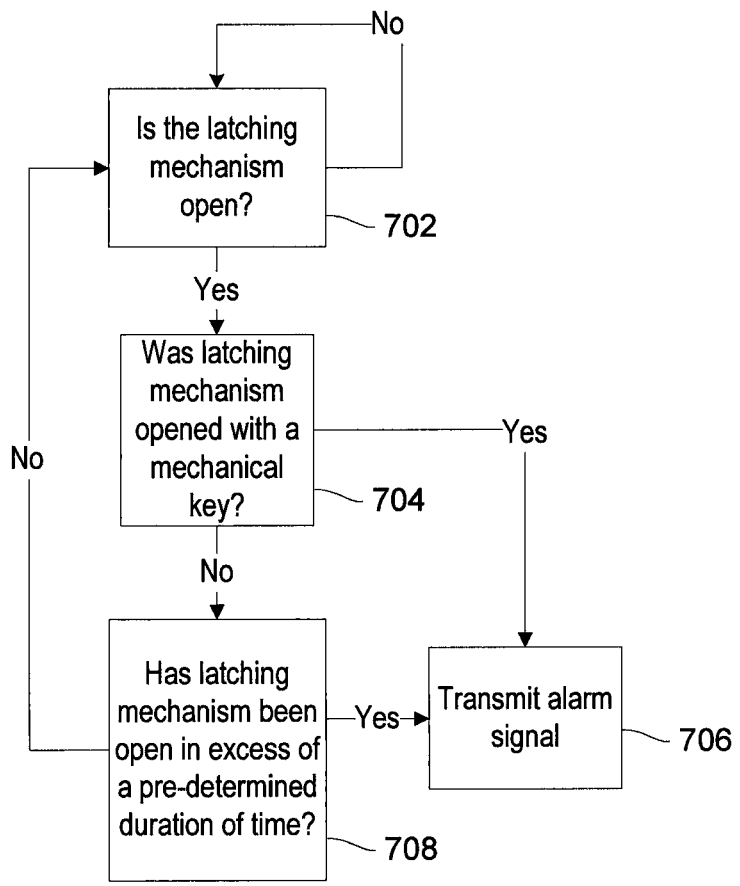
FIG. 7 is a flowchart of an exemplary method for monitoring a latching mechanism state.

Referring now to FIG. 7, a flowchart setting forth the steps of an exemplary method for monitoring a latching mechanism state is shown. The method begins by monitoring whether the swing latch 36 of the latching mechanism 16 is open or closed, as indicated in step 702. If the latching mechanism 16 is closed, then the latching mechanism 16 is continually or periodically monitored to check if the swing latch 36 is open, as indicated by the arrows surrounding step 702. Once the latching mechanism 16 is open, then it is established if the latching mechanism 16 was opened after unlocking the swing latch 36 using a mechanical key according to step 704. In the contemplated embodiment, authorized users typically unlock the latching mechanism 16 to access the cabinet using an electronic key card that identifies the user. The use of a mechanical key can constitute an override condition of the lock of the latching mechanism 16 and may be cause for security concern.

If the latching mechanism 16 was opened with an override key as queried to step 704, then an alarm is triggered as indicated in step 706. Again, this alarm can include the transmission of an alarm signal which could be audible, visual, an electronic signal to a computing device and so forth. If the latching mechanism 16 was not opened with an override key in step 704, then this alarm may not be triggered and it may subsequently be established whether the latching mechanism 16 has been opened for a length of time exceeding a pre-determined or pre-established duration of time, as indicated in step 708. If the latching mechanism 16 has been open for too long, an alarm may be triggered, as indicated in step 706. If the latching mechanism 16 has not been open for a length of time exceeding the pre-established duration of time, then the monitoring cycle may be restarted or continued.

It is contemplated that the methods described above with respect to FIGS. 6 and 7 can be simultaneously monitored to enhance security of the cabinet. These methods may additionally be combined with other monitoring and alarm conditions to provide additional layers of security or to monitor and/or to log discrete access to a secure cabinet or plurality of cabinets. In one particularly advantageous access report, it is contemplated that information relating to the opened or closed state of the door 12, the open or closed state of the latching mechanism 16, and whether an override key has been used can be combined to provide a comprehensive access log that highlights conditions or time the cabinet was unsecure and who accessed the cabinet prior to the unsecure condition.

Notably, having separate alarm conditions relating to the state of the latching mechanism 16 and the swing latch 36 in addition to the state of the door 12 permit for the capture of events that compromise security that might be missed using other systems. For example, an authorized user might unlock the latching mechanism 16, open the door 12 to access the inside of the secure cabinet, and then close the door 12. However, if the swing latch 36 is not moved back down to the closed position and locked, it is possible an unauthorized user may use the unsecured swing latch 36 to improperly access the secure cabinet even though the door 12 registers as closed. By providing a cabinet assembly monitoring these separate conditions, the cabinet can be made more secure.

It is contemplated that, in some embodiments, the latching mechanism 16 may be remotely locked or unlocked. For example, the door 12 may remotely unlocked, by transmitting a signal to unlock the latching mechanism 16, permitting the swing latch 36 to be operated to open the door 12. Further, the door 12 might be remotely put into a lockout state (a state in which the electronic locking mechanism 40 may not be unlocked using the key card). In some configurations, the mechanical key can always provide access to the cabinet by unlocking the latching mechanism even if the use of a key card has been electronically locked out or if power is lost such that the latching mechanism 16 is unable to be electronically unlocked.

Further, as noted above, it is contemplated that the housing 20 of enclosure assembly 14 may receive a RFID tag reader or other near field communication device. It is contemplated that the various components of the rack inside the cabinet may be uniquely tagged using RFID tags or other such near field communication tags. The reader in the housing 20 may periodically read these tags in order to establish an inventory of the components in the cabinet. When the door 12 is opened and closed to access the inside of the cabinet, the reader may re-inventory the components in the cabinet to establish whether any components have been added or removed. When coupled to a system that also uniquely identifies and records the users accessing the cabinet (by virtue of the keycard used or so forth), such an arrangement may be used to more securely track individual access to various system components and provide alerts in suspicious conditions. For example, a user might access a cabinet, remove a sensitive component such as a hard drive without specific authorization, copy the contents of the hard drive, and replace the hard drive. By monitoring and tracking the user access and inventory of the cabinet, inappropriate handling of equipment that may raise a security concern can promptly be identified or deterred.

It should be appreciated that various other modifications and variations to the preferred embodiments can be made within the spirit and scope of the invention. Therefore, the invention should not be limited to the described embodiments. To ascertain the full scope of the invention, the following claims should be referenced.

What is claimed is:

1. An enclosure assembly for securely mounting an electronic component to an exterior surface of a door via attachment of a latching mechanism to the door, the enclosure assembly comprising:
   a mounting frame having a mounting opening formed therein through which the latching mechanism is attachable to the door for securely mounting the mounting frame of the enclosure assembly to the door, the mounting frame further having a base end; and
   a housing connected to the mounting frame at the base end, the housing having an interior volume into which the electronic component is receivable and including sidewalls that, at least in part, define the interior volume and that include at least one connection opening formed therein for reception of the base end of the mounting frame, the base end of the mounting frame being received in the at least one connection opening to securely connect the mounting frame to the housing,
   wherein the enclosure assembly includes a rearward-facing contact surface for contacting the exterior surface of the door, such that the interior volume of the housing is disposed entirely forward of the rearward-facing contact surface.

2. The enclosure assembly of claim 1, wherein the at least one connection opening includes at least two connection openings and wherein each of the at least two connection openings is configured to receive the base end of the mounting frame.

3. The enclosure assembly of claim 2, wherein a filler plate is received into each of the at least two connection openings into which the base end of the mounting frame is not received.

4. The enclosure assembly of claim 1, wherein the housing comprises a cable opening configured to receive at least one cable.

5. The enclosure assembly of claim 1, wherein the base end of the mounting frame includes a channel formed therein whereby the base end of the mounting frame is in communication with the interior volume of the housing through the at least one connection opening and the channel.

6. The enclosure assembly of claim 1, wherein the housing comprises a front half and a rear half that are connected together and wherein connecting the front half and the rear half together secures the base end of the mounting frame in the at least one connection opening.

7. The enclosure assembly of claim 6, further comprising at least one fastener which is used to connect the front half of the housing to the rear half of the housing.

8. The enclosure assembly of claim 7, wherein the enclosure assembly has a mounting plane on a back side thereof for contacting the exterior side of the door, the mounting plane including portions of both the mounting frame and the rear half of the housing, wherein the at least one fasteners is only accessible from the rear half of the housing through the mounting plane.

9. A secure cabinet assembly comprising:
   a cabinet having a door that provides selective access to an interior of the cabinet;
   a latching mechanism mounted to the door, the latching mechanism adapted to selectively lock the door and provide access to the interior of the cabinet via the door; and
   an enclosure assembly securely mounted to an exterior surface of the door via connection of the latching mechanism to an exterior surface of the door, the enclosure assembly comprising:
      a mounting frame having a mounting opening formed therein through which the latching mechanism is attached to the door, thereby securely mounting the mounting frame of the enclosure assembly to the door, the mounting frame further having a base end; and
      a housing connected to the mounting frame at the base end, the housing having an interior volume in which an electronic component is received, and including sidewalls that, at least in part, define the interior volume and that include at least one connection opening formed therein for reception of the base end of the mounting frame, the base end of the mounting frame being received in the at least one connection opening to securely connect the mounting frame to the housing,
   wherein the enclosure assembly includes a rearward-facing contact surface for contacting the exterior surface of the door, such that the interior volume of the housing is disposed entirely forward of the rearward-facing contact surface.

10. The secure cabinet assembly of claim 9, wherein the at least one connection opening includes at least two connection openings and wherein each of the at least two connection openings is configured to receive the base end of the mounting frame.

11. The secure cabinet assembly of claim 10, wherein a filler plate is received into each of the at least two connection openings into which the base end of the mounting frame is not received.

12. The secure cabinet assembly of claim 9, wherein the latching mechanism further comprises a first cable, wherein the electronic component is configured to receive the first cable through a passageway in the base end of the mounting frame.

13. The secure cabinet assembly of claim 12, wherein the circuit board is configured to receive a second cable through a cable opening in the housing.

14. The secure cabinet assembly of claim 13, wherein the housing comprises a front half and a rear half that are connected together and wherein connecting the front half and the rear half together secures the base end of the mounting frame in the at least one connection opening.

15. The secure cabinet assembly of claim 14 further comprising at least one fastener which is used to connect the front half of the housing to the rear half of the housing.

16. The secure cabinet assembly of claim 15, wherein the enclosure assembly has a mounting plane on a back side thereof for contacting the exterior side of the door, the mounting plane including portions of both the mounting frame and the rear half of the housing, wherein the at least one fastener is only accessible from the rear half of the housing through the mounting plane.

\* \* \* \* \*